United States Patent [19]

Togawa

[11] Patent Number: 5,281,912
[45] Date of Patent: Jan. 25, 1994

[54] MAGNETO-OPTIC MAGNETIC-FIELD MEASURING APPARATUS FOR MEASURING A MAGNETIC FIELD INTENSITY BY MEASURING AN ANGLE OF DIFFRACTION

[75] Inventor: Masayuki Togawa, Gifu, Japan

[73] Assignee: Teijin Seiki Co., Ltd., Osaka, Japan

[21] Appl. No.: 836,834

[22] Filed: Feb. 19, 1992

[30] Foreign Application Priority Data

Mar. 1, 1991 [JP] Japan .................... 3-034932

[51] Int. Cl.⁵ .................. G01R 33/032; G02F 1/09
[52] U.S. Cl. ...................... 324/244.1; 250/227.21; 359/280
[58] Field of Search ................ 324/96, 244.1; 350/375–378; 359/280–284, 558, 484; 250/227.14, 227.21, 231.1

[56] References Cited

U.S. PATENT DOCUMENTS

| 4,195,261 | 3/1980 | Zwingman ................ 324/210 |
| 4,695,796 | 9/1987 | Omet et al. ............ 324/244.1 X |
| 4,896,103 | 1/1990 | Shimanuki et al. ...... 324/244.1 X |

FOREIGN PATENT DOCUMENTS

| 0208476 | 1/1987 | European Pat. Off. ... G01R 33/032 |
| 0393889 | 4/1990 | European Pat. Off. ....... G02F 1/09 |
| 0711508 | 1/1980 | U.S.S.R. ..................... 324/244.1 |
| 1348760 | 10/1987 | U.S.S.R. .................... 324/244.1 |

OTHER PUBLICATIONS

Torok et al.; "Lorentz" microscopy of stripe domain films with photons, IEEE Transactions on Magnetics vol. Mag-10, No. 1, pp. 18–22, Mar. 1974.

SPIE, Proc . ECO., "Electro-Optic and Magneto-Optic Materials II", vol. 1274, Mar. 1990, Bellingham, Wash. US, pp. 260–269.

Thin Solid Films, vol. 114, No. 1/2, Apr. 1984, Lausanne, Switzerland, pp. 187–219; P. Paroli, "Magneto-Optical Devices Based on Garnet Films".

Primary Examiner—Gerard R. Strecker
Attorney, Agent, or Firm—Lane, Aitken & McCann

[57] ABSTRACT

A magnetic-field measuring apparatus comprising a polarizing element for generating polarized light that transmits parallel to the lines of magnetic force of a first magnetic field, a Faraday effect element for generating a banded magnetic domain substantially perpendicular to the transmission direction of the polarized light generated by the polarizing element and for diffracting the polarized light by the banded magnetic domain, a magnetic-field generating unit for generating a second magnetic field having lines of magnetic force which cross at right angles with the transmission direction of the polarized light generated by the polarizing element and are parallel to the banded magnetic domain generated by the Faraday effect element, a position detecting unit for detecting a position at which diffracted light of other than zero-order diffracted by the Faraday effect element is received, and a magnetic-field-intensity detecting unit for detecting a magnetic field intensity of the first magnetic field on the basis of the result of detection of the position detecting unit.

5 Claims, 4 Drawing Sheets

MAGNETIC FIELD TO
BE MEASURED

MAGNETO-OPTIC MAGNETIC-FIELD MEASURING APPARATUS FOR MEASURING A MAGNETIC FIELD INTENSITY BY MEASURING AN ANGLE OF DIFFRACTION

FIELD OF THE INVENTION

The present invention relates to a magnetic-field measuring apparatus, and more particularly to such an apparatus for optically measuring a magnetic field intensity.

DESCRIPTION OF THE PRIOR ART

There is known a conventional magnetic-field measuring apparatus of an optical type such as that shown in FIG. 4.

In FIG. 4, the light emitted from a semiconductor laser 1 is confined within a first optical fiber 2 and propagated. The light from the output end of the optical fiber 2 is collimated by a first lens 3 and transmitted through a first polarizer 4, a Faraday effect element 5 and through a second polarizer 6. The directions of transmission of the first and second polarizers 4 and 5 are inclined at an angle of 45° with each other. The light transmitted through the second polarizer 6 is focused by a second lens 7 and propagated through a second optical fiber 8 to a photodetector 9. The light received by the photodetector 9 is converted into an electric signal by a light-electric converter (not shown) and is processed with an electric circuit (not shown), then the magnetic field intensity is measured.

The detection principles of a magnetic field intensity by the apparatus described above will hereinafter be described.

Generally, the Faraday effect element 5 is an element that causes the plane of polarization of light to rotate. It is known that the relation between the rotational angle $\theta_F$ of the plane of polarization and the magnetic field intensity H in the direction parallel to the magnetic flux is expressed by the following equation:

$$\theta_F = V \cdot L \cdot H \qquad (1)$$

where V is a Verdet's constant (eigenvalue of a substance forming the Faraday effect element), and L (FIG. 4) is a transmission length of the Faraday effect element in the direction of light transmission. If the Verdet's constant V and the transmission length L are suitably selected, the Faraday rotational angle $\theta_F$ can be made +45° at the time that the magnetic field intensity H has become a predicted maximum value when a magnetic field of the axis of easy magnetization as shown by the arrow in FIG. 4 is applied. Also, if a magnetic field is applied in the reverse direction when V and L are selected in the way described above, the Faraday rotational angle $\theta_F$ will become −45° at the time that the magnetic field intensity H has become the predicted maximum value described above. If V and L are selected in the way described above and when the magnetic field H, as shown in FIG. 5, changes between magnetically saturated points ±Hs, the Faraday rotational angle $\theta_F$ will change substantially linearly between $-\pi/4$ and $\pi/4$.

The direction of polarization of the second polarizer 6 with respect to that of the first polarizer 4 is inclined 45° in the same direction as the rotational direction of the plane of polarization caused by the Faraday effect element 5 as a magnetic field is applied in the axis of easy magnetization. By setting the direction of polarization of the second polarizer 6 in the above way, the light power Po after passing through the second polarizer 6 can be changed between zero and the maximum light power, when the Faraday rotational angle $\theta_F$ changes between $-\pi/4$ and $\pi/4$. If $-\pi/4 < \theta_F < \pi/4$, the light power Po is expressed by the following equation (2):

$$Po \, \alpha \, \sin(\theta_F + \pi/4) \qquad (2)$$

Therefore, the relation between the magnetic field intensity H of a magnetic field to be measured and the light power Po after light passes through the second polarizer 6 is shown in FIG. 6. From this relation the above described electric circuit (not shown) can measure a magnetic field intensity on the basis of a signal from the photodetector 9. The graph shown in FIG. 6 is a sine curve, so it is necessary that the output signal of the photodetector 9 is corrected with the electric circuit. In order to avoid this electrical correction, the measurement of the magnetic field is made by using only a nearly straight line portion of the sine curve, i.e., the bold line portion in FIG. 6.

However, the conventional magnetic-field measurement apparatus has its drawbacks in that the cost of production is increased if a measurement sensitivity is enhanced and that it is difficult to improve a measurement accuracy, for the following reasons.

That is to say, if only the nearly straight line portion of the sine curve is used as described above, the measurable range of the magnetic field of the Faraday effect element 5 becomes a narrow range from $H_1$ to $H_2$. Therefore, in order to improve a sensitivity in measurement, it is necessary, from equation (1), that the Verdet's constant V or the transmission length L of the Faraday effect element is increased. However, the Verdet's constant V cannot be increased since it is an eigenvalue of a substance. Hence, it is necessary to make the transmission length L large. But, if the transmission length L is made large, the light power passing through the Faraday effect element 5 becomes small, so that it is necessary to increase the amplification factor of the light-power detecting circuit in the above described electric circuit. If the amplification factor of the light-power detecting circuit is increased, various noises of the photodetector 9 and the light-power detecting circuit are amplified and the detection of signal components becomes very difficult. Therefore, an improvement in a measurement sensitivity is difficult, and even in the case of a little improvement in a measurement sensitivity, electronic components whose noises are small must be used. The specific electronic components such as this result in an increase in the cost of production.

In addition, in the conventional apparatus described above, the magnetic field intensity is measured on the basis of the power of the light that has passed through the Faraday effect element 5 and through the second polarizer 6. Therefore, for example, in a case where substances interrupting light, such as dust, exist on the optical paths, or in a case where the light power or wavelength of a source of light changes, the light power to be detected will change, so that an apparently incorrect magnetic field intensity is measured and an improvement in the accuracy of measurement becomes difficult.

It is, accordingly, an important object of the present invention to provide a magnetic-field measuring apparatus in which a measurement sensitivity is greatly improved without increasing a cost of production and also a measurement accuracy is greatly improved.

SUMMARY OF THE INVENTION

In accordance with one important aspect of the present invention, there is provided a magnetic-field measuring apparatus comprising first polarizing means for generating polarized light that propagates parallel to the lines of magnetic force of a magnetic field to be measured, and a Faraday effect element for generating a banded magnetic domain substantially perpendicular to the transmission direction of the polarized light generated by the first polarizing means and for diffracting the polarized light by the banded magnetic domain. The magnetic-field measuring apparatus further comprises magnetic-field generating means for generating a second magnetic field having lines of magnetic force which cross at right angles with the transmission direction of the polarized light generated by the first polarizing means and are parallel to the banded magnetic domain generated by the Faraday effect element, position detecting means for detecting a position at which diffracted light of other than zero-order diffracted by the Faraday effect element is received, and magnetic-field-intensity detecting means for detecting a magnetic field intensity of the first magnetic field on the basis of the result of detection of the position detecting means.

The magnetic-field detecting apparatus may further comprise second polarizing means disposed in an optical path between the Faraday effect element and the position detecting means.

The second polarizing means may comprise a polarizing beam splitter, and the position detecting means may comprise two photodetectors.

BRIEF DESCRIPTION OF THE DRAWINGS

The above and other objects and advantages will become apparent from the following detailed description when read in conjunction with the accompanying drawings wherein.

DESCRIPTION OF THE PREFERRED EMBODIMENTS

Figure 1:
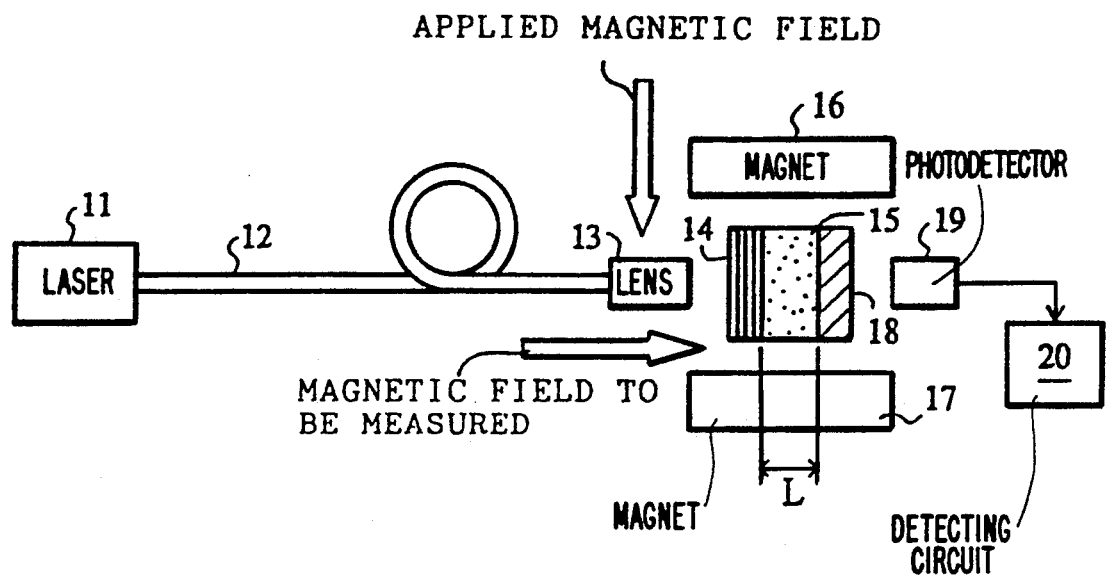
FIG. 1 is a longitudinal elevational view illustrating an embodiment of a magnetic-field measuring apparatus according to the present invention.
Figure 2:
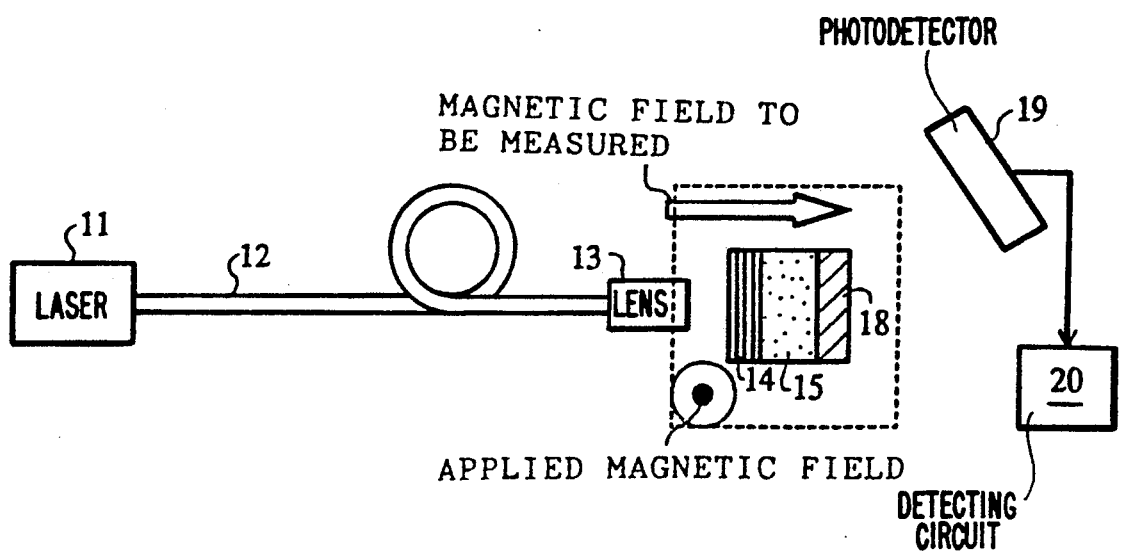
FIG. 2 is a top plan view of the apparatus of FIG. 1.

Referring to FIGS. 1 and 2, there is shown a preferred embodiment of a magnetic-field measuring apparatus in accordance with the present invention. Reference numeral 11 denotes a semiconductor laser from which light is emitted. The light is confined within an optical fiber 12 and transmitted. The light from the output end of the optical fiber 12 is collimated by a lens 13 and transmitted to a first polarizer 14. The light from the first polarizer 14 becomes linearly polarized light having a plane of polarization of a predetermined direction. The transmission direction of this linearly polarized light is parallel to the directions of the lines of magnetic force of a magnetic field to be measured. Therefore, the semiconductor laser 11, optical fiber 12, lens 13 and the polarizer 14 as a whole constitute polarized-light generating means for generating linearly polarized light that propagates in the direction parallel to the lines of magnetic force of a magnetic field to be measured. In the optical path of the linearly polarized light in the magnetic field to be measured, there is provided a Faraday effect element 15, which generates a banded magnetic domain substantially parallel to the transmission direction of the linearly polarized light. The light that passed through the polarizer 14 is diffracted by the banded magnetic domain. Reference numerals 16 and 17 are magnets that generate a magnetic field having lines of magnetic force which are at right angles with the transmission direction of the light from the polarizer 14. Therefore, the magnets 16 and 17 apply a magnetic field to the Faraday effect element 15 so that the banded magnetic domain becomes parallel to the lines of magnetic force of the applied magnetic field, and the magnets 16 and 17 constitute magnetic-field generating means.

The diffracted light other than zero-order diffracted light which was diffracted by the Faraday effect element 15 is transmitted through a second polarizer 18 to a photodetector 19. The photodetector 19, for example, comprises a photodiode array and outputs a signal corresponding to the position at which the diffracted light is received. Thus, the photodetector 19 constitutes position detecting means for detecting a position at which diffracted light of other than zero-order diffracted by the Faraday effect element 15. The output of the photodetector 19 is inputted to a magnetic-field-intensity detecting circuit 20, which constitutes magnetic-field-intensity detecting means for detecting a magnetic field intensity on the basis of the result of detection of the photodetector 19. The direction of polarization of the second polarizer 18 is arranged so that the light diffracted by the banded magnetic domain and transmitted through the polarizer 18 spreads in the direction perpendicular to FIG. 1 and in the up-and-down direction of FIG. 2. Therefore, the photodetector 19 is provided so that it can receive the light spreading in the above described directions. The second polarizer 18 is provided between the Faraday effect element 15 and the photodetector 19 and constitutes second polarizing means.

The detection principles of a magnetic field intensity by the apparatus described above will hereinafter be described.

For convenience, it is assumed that the Faraday effect element 15 has a uniaxial anisotropy perpendicular to FIG. 1, although it may have not only a uniaxial anisotropy but also a biaxial or tri-axial anisotropy. For example, it is known that a yttrium iron garnet (YIG) which is a typical material of the Faraday effect element has a uniaxial anisotropy.

If a uniaxial anisotropy constant is expressed by Ku, a spontaneous magnetization by Is and a magnetic permeability by $\mu o$, the relation between them can be expressed by the following equation (3):

$$Ku \geq Is^2/2\mu o \qquad (3)$$

Figure 3:
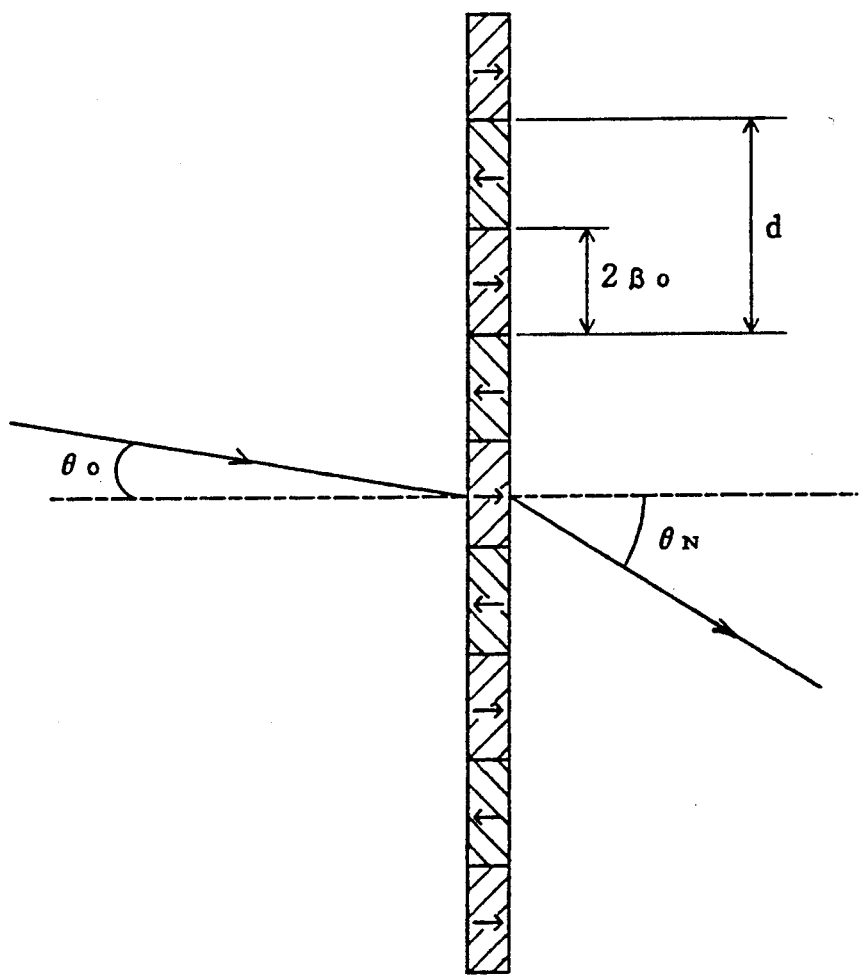
FIG. 3 is an illustration used to explain the operation of the Faraday effect element of FIG. 1.
Figure 4:
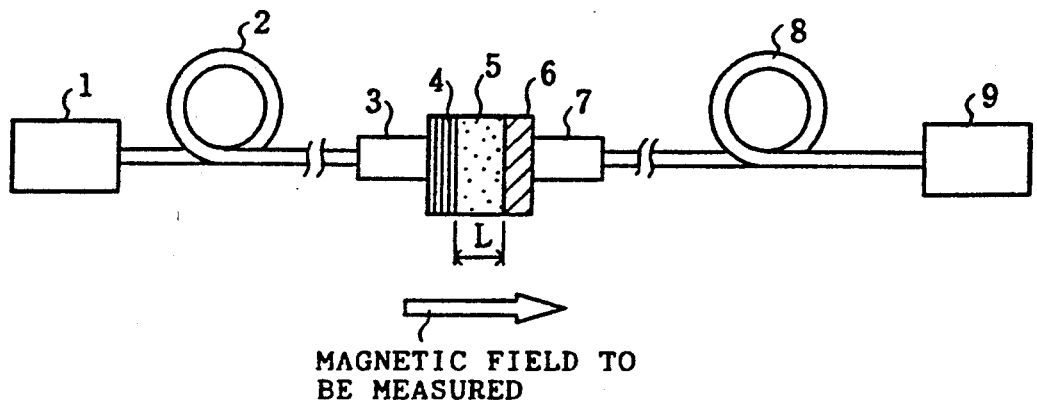
FIG. 4 is a longitudinal elevational view illustrating a conventional magnetic-field measuring apparatus.
Figure 5:
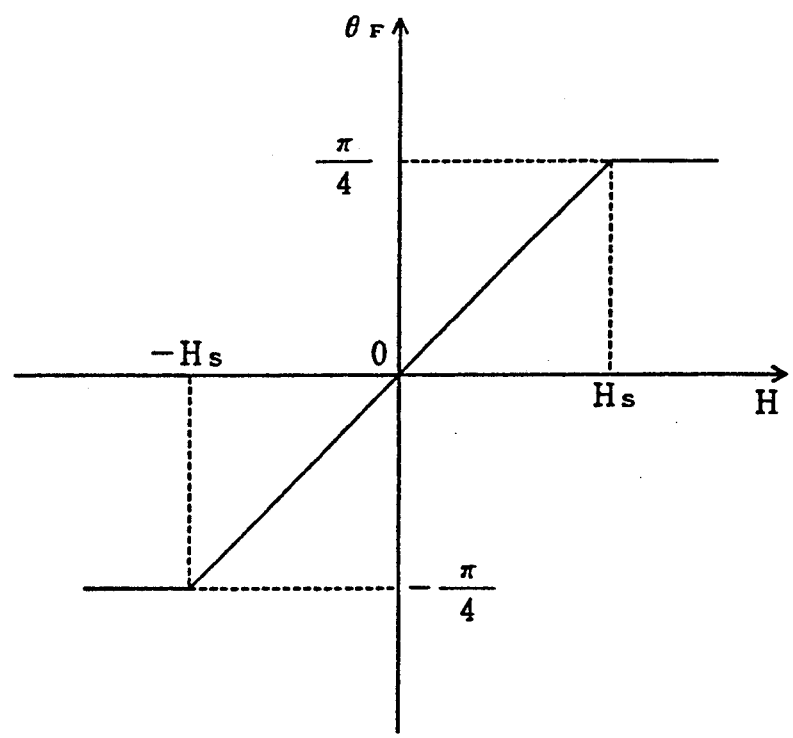
FIGS. 5 and 6 are diagrams used to explain the principles of measurement of the conventional magnetic-field measuring apparatus.
Figure 6:
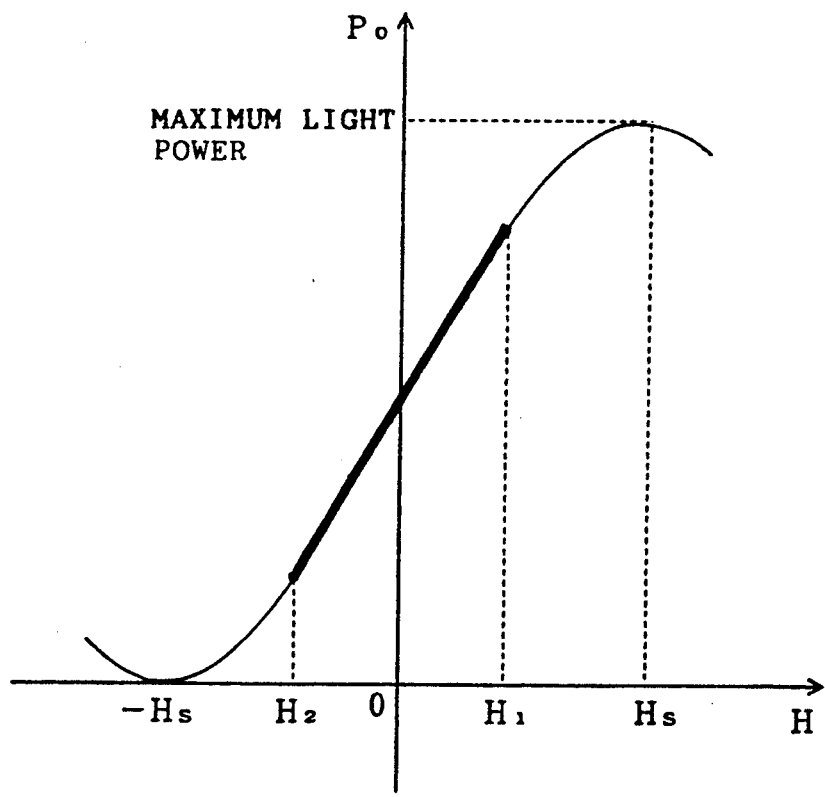

In general, the banded magnetic domain in the Faraday effect element is shown in FIG. 3. The banded magnetic domain consists of plural magnetic domains, and two adjacent magnetic domains are opposite in the direction of magnetization. The direction of magnetization is indicated by the arrow in FIG. 3, and it is assumed that a magnetic domain having magnetization of the right-hand direction in FIG. 3 is a first magnetic domain and a magnetic domain having magnetization of the left-hand direction is a second magnetic domain. If light is transmitted through the Faraday effect element from left to right in FIG. 3, the direction of the polarized light will be rotated as follows, depending upon the direction of the magnetization of the magnetic domain. That is, when light is transmitted through the first magnetic domain having the same direction as the transmission direction of the light, it rotates through 45° in the clockwise direction. When, on the other hand, light is transmitted through the second magnetic domain having the opposite direction of the transmission direction of the light, it rotates through 45° in the opposite direction. Therefore, the light beams transmitted through the banded magnetic domain of the Faraday effect element differ by 90° in the direction of polarization from one another. In addition, the light transmitted through the banded magnetic domain is diffracted, and the light beams having the same polarization direction component interfere each other. As shown in FIG. 3, if the incident angle is $\theta_0$ and the angle of N-order diffracted light is $\theta_N$ (N=0, 1, 2, ...), the light intensity $I_{(P)}$ of the N-order diffracted light will be given by the following equation (4):

$$I_{(P)} = I_0 \left( \frac{\sin(2\pi\xi_0 P/\lambda)}{2\pi\xi_0 P/\lambda} \right)^2 \left( \frac{\sin(\pi M d P/\lambda)}{M\sin(\pi d P/\lambda)} \right)^2 \quad (4)$$

where $P=\sin\theta_N-\sin\theta_0$, $2\xi_0$ is a width of the magnetic domain, d is a pitch of the magnetic domain, MN is ½ of the number of the magnetic domains through which the light is transmitted, and $\lambda$ is wavelength.

If magnetic field having lines of magnetic force parallel to the transmission direction of light is applied to the banded magnetic domain of FIG. 3 from the outside, the width of the magnetic domain will change in proportion to the intensity of the external magnetic field. If a magnetic saturation point is expressed by Hs, the width of the magnetic domain will be expressed by $2\xi_0=(d/2HS)H$. Therefore, if the intensity of external magnetic field changes, $2\xi_0$ will change, and if $I_{(P)}$ is maintained constant, the angle $\theta_N$ of the N-order diffracted light will change.

As will be understood from the foregoing principles, the position of the light which is detected by the photodetector 19 varies in accordance with the intensity of magnetic field to be measured. Therefore, on the basis of the detection result of the photodetector 19, the detecting circuit 20 can detect the intensity of the magnetic field to be measured. Concretely, the magnetic field intensity is detected by detecting a change in the peak power position of the first-order diffracted light beam among the light beams diffracted by the Faraday effect element 15. As previously described, the light transmitted through the Faraday effect element 15 differ by 90° in the direction of polarization from one another. However, since only light having one direction of the two different polarization directions are transmitted through by the polarizer 18 and spread only in one direction, only the displacement of the position of the receive light in that direction is detected by the photodetector 19. While it has been described that the photodetector 19 comprises a photodiode array, it is noted that it may also comprise a charge coupled device (CCD) or position detecting element for measuring light power distribution. In addition, in the embodiment of the present invention the photodetector 19 is spaced apart from the polarizer 18, but they may also be bonded together. Further, the magnetic-field-intensity detecting means is not limited to the magnetic-field-intensity detecting circuit 20. For example, it may comprise a microcomputer.

As described above, when in the embodiment the Faraday effect element is saturated, it is set according to equation (1) so that the Faraday rotational angle becomes 45° ($\pi/4$ radian). The Faraday effect element is always saturated by spontaneous magnetization, so its magnetic domains are in the form of banded structure. The measurable magnetic field intensity is saturated magnetic field intensity in which the magnetic domains are in the form of banded structure. In addition, because a diffracted angle is diffracted angle is detected in the detection of the magnetic field intensity, a measurement sensitivity can be easily greatly improved by making longer the distance between the Faraday effect element and the photodetector.

In addition, in order to obtain the same measurement sensitivity as the present invention with the aid of the conventional apparatus using only the nearly straight line portion of the above described sine curve, it is necessary to increase the transmission length L of the present invention many times. As previously described, if the transmission length L is increased like this, the above-mentioned drawbacks, such as an increase in noises and an increase in the cost of production, will arise. Since in the present invention it is not necessary to make the transmission length L longer, the drawbacks of the conventional apparatus can be overcome in accordance with the present invention.

Further, since in the present invention the light transmitted to the photodetector 19 is required to have light power enough to detect the position of the receive light accurately, a measurement accuracy can be prevented from being reduced even if the light power of the light transmitted to the photodetector 19 is somewhat varied by the presence of substances interrupting light along the optical path or by a change in the light power or wavelength of a light source.

Accordingly, a sensitivity in measurement without increasing the cost of production, and an accuracy in measurement can be improved in accordance with the present invention.

In addition, the measurement accuracy can be further improved by using a polarizing beam splitter in the form of a prism or film instead of the polarizer 18 and providing two photodetectors 19. That is, although, as described above, the light beams transmitted through the Faraday effect element 15 differ by 90° in the direction of polarization, only the light beam having one direction of the two polarization directions can be guided to one of two photodetectors and only the light beam having the other direction can be guided to the other photodetector by means of the polarizing beam splitter provided instead of the polarizer 18. In that case, the magnetic-field-intensity detecting circuit can detect the magnetization intensity of a magnetic field to be measured, performing a differential detection. More particularly, if in FIG. 3 magnetic field in the transmission direction of light is increased, the width $2\xi_0$ of the first magnetic domain becomes large and first-order diffracted light is shifted to the side of zero-order light. On the other hand, the width $(d-2\xi_0)$ of the second magnetic domain becomes small because of the increase in the width $2\xi_o$ of the first magnetic domain. If a calculation is made by replacing $2\xi_o$ of the above-described equation (4) with $(d-2\xi_o)$, the first-order diffracted light is shifted to the side opposite to zero-order light. It is noted that a magnetic wall exists between two adjacent magnetic domains, but it is ignored for simplicity. Of course, the above-described principles remain the same even if ignored. Therefore, by separately detecting the light transmitted through the first and second magnetic domains, i.e., the first-order diffracted light by means of two photodetectors and by detecting a difference between the outputs of the two photodetectors by means of the magnetic-field-intensity detecting circuit, the random noises of the photodetectors can be cancelled out. Two diffracted lights differing in the polarization direction can be separated, so that an accuracy in detection can be greatly improved.

Although the present invention has been described with linearly polarized light, a magnetic field can be measured in the same way by means of elliptically polarized light that can be considered to be linearly polarized light.

In accordance with the present invention, the diffracted light of other than zero-order which is diffracted by the Faraday effect element is received, and on the basis of the position at which that diffracted light is received, the intensity of magnetic field to be measured is detected. Therefore, as compared with the conventional apparatus detecting a magnetic field intensity on the basis of a change in a light power, a sensitivity in measurement without increasing a cost of production can be greatly improved and also an accuracy in measurement can be greatly improved.

While the subjection invention has been described with relation to the preferred embodiment, various modifications and adaptations thereof will now be apparent to those skilled in the art. All such modifications and adaptations as fall within the scope of the appended claims are intended to be covered thereby.

What I claim is:

1. A magnetic-field measuring apparatus comprising:
   first polarizing means for generating polarized light that transmits parallel to the lines of magnetic force of a magnetic field to be measured;
   a Faraday effect element for generating a banded magnetic domain substantially perpendicular to the transmission direction of said polarized light generated by said first polarizing means and for diffracting said polarized light by said banded magnetic domain;
   magnetic-field generating means for generating a second magnetic field having lines of magnetic force crossing at right angles with the transmission direction of polarized light generated by said first polarizing means so that said banded magnetic domain generated by said Faraday effect element becomes parallel to said second magnetic field;
   position detecting means for detecting a position at which diffracted light of other than zero-order diffracted by said Faraday effect element is received with respect to a reference position; and
   magnetic-field-intensity detecting means for detecting a magnetic field intensity of said magnetic field to be measured on the basis of the result of detection of said position detecting means.

2. A magnetic-field detecting apparatus as set forth in claim 1, which further comprises second polarizing means disposed in an optical path between said Faraday effect element and said position detecting means.

3. A magnetic-field detecting apparatus as set forth in claim 1, wherein said position detecting means comprises a photodetector.

4. A magnetic-field detecting apparatus as set forth in claim 2, wherein said second polarizing means comprises a polarizing beam splitter and said position detecting means comprises two photodetectors.

5. A magnetic-field detecting apparatus as set forth in claim 1, wherein said polarized light is linearly polarized light.

* * * * *